(12) United States Patent
Adams

(10) Patent No.: US 10,098,249 B2
(45) Date of Patent: Oct. 9, 2018

(54) CABLE ASSEMBLY MANAGEMENT ELEMENTS AND FIXTURE

(71) Applicant: Jacob Adams, Dunlap, IL (US)

(72) Inventor: Jacob Adams, Dunlap, IL (US)

( * ) Notice: Subject to any disclaimer, the term of this patent is extended or adjusted under 35 U.S.C. 154(b) by 110 days.

(21) Appl. No.: 15/288,552

(22) Filed: Oct. 7, 2016

(65) Prior Publication Data
US 2017/0105305 A1 Apr. 13, 2017

Related U.S. Application Data

(60) Provisional application No. 62/238,956, filed on Oct. 8, 2015.

(51) Int. Cl.
| | |
|---|---|
| *G02B 6/38* | (2006.01) |
| *H01R 13/443* | (2006.01) |
| *H01R 13/52* | (2006.01) |
| *H05K 7/10* | (2006.01) |
| *H01R 24/64* | (2011.01) |
| *H01R 13/46* | (2006.01) |
| *H01R 13/518* | (2006.01) |
| *H01R 13/60* | (2006.01) |
| *H04Q 1/00* | (2006.01) |
| *H04Q 1/06* | (2006.01) |
| *H04Q 1/02* | (2006.01) |
| *G02B 6/44* | (2006.01) |
| *G02B 6/42* | (2006.01) |

(52) U.S. Cl.
CPC .............. *H05K 7/10* (2013.01); *G02B 6/3895* (2013.01); *H01R 13/465* (2013.01); *H01R 13/518* (2013.01); *H01R 13/60* (2013.01); *H01R 24/64* (2013.01); *H04Q 1/00* (2013.01); *H04Q 1/06* (2013.01); *H04Q 1/13* (2013.01); *G02B 6/4292* (2013.01); *G02B 6/4482* (2013.01); *H01R 2201/04* (2013.01)

(58) Field of Classification Search
None
See application file for complete search history.

(56) References Cited

U.S. PATENT DOCUMENTS

| | | | | |
|---|---|---|---|---|
| 5,620,335 | A * | 4/1997 | Siemon | H01R 13/46 439/447 |
| 5,637,002 | A * | 6/1997 | Buck | H01R 13/443 439/148 |

(Continued)

*Primary Examiner* — Jerry Rahll
(74) *Attorney, Agent, or Firm* — Leydig, Voit & Mayer, Ltd.

(57) ABSTRACT

A fixture for temporarily mounting connectors of a plurality of cable assemblies is provided for use while replacing an electronic component having a plurality of receptacles. Each cable assembly has a connector disposed in one of the receptacles. The fixture includes a body, an array of cavities disposed on the body, and an array of body indicia. Each cavity receives one of the connectors therein and each body indicia is disposed adjacent one of the cavities, with each body indicia being unique relative to other body indicia. A plurality of the pluggable identifier elements are provided with each pluggable identifier element being pluggable into one of the cavities and including an element indicia. Each element indicia corresponds to one of the body indicia and is unique relative to other element indicia. A kit of pluggable identifier elements and a method of replacing an electronic component is also provided.

19 Claims, 11 Drawing Sheets

(56) References Cited

U.S. PATENT DOCUMENTS

| | | | | |
|---|---|---|---|---|
| 6,309,247 B1 * | 10/2001 | Wang | ............... | H01R 13/5213 |
| | | | | 439/135 |
| 6,390,848 B1 * | 5/2002 | Murakami | ............ | H01R 13/443 |
| | | | | 439/148 |
| 7,427,204 B1 * | 9/2008 | Mangone | ............. | H01R 13/443 |
| | | | | 439/148 |
| D579,412 S * | 10/2008 | Mangone, Jr. | ............... | D13/133 |
| 7,722,378 B2 * | 5/2010 | Morrison | ........... | H01R 13/5213 |
| | | | | 439/344 |
| 8,662,921 B2 * | 3/2014 | Kataoka | ............... | H01R 13/443 |
| | | | | 439/148 |
| 8,672,694 B2 * | 3/2014 | Lee | ..................... | H01R 13/443 |
| | | | | 439/133 |
| 2001/0007802 A1 * | 7/2001 | Horner | ................. | H01R 13/443 |
| | | | | 439/588 |
| 2002/0142654 A1 * | 10/2002 | Bobay | ................. | H01R 13/443 |
| | | | | 439/587 |
| 2006/0094291 A1 * | 5/2006 | Caveney | ............. | H01R 13/641 |
| | | | | 439/540.1 |
| 2006/0148279 A1 * | 7/2006 | German | ............... | H01R 13/465 |
| | | | | 439/49 |
| 2007/0249195 A1 * | 10/2007 | Tomita | ................. | H01R 13/443 |
| | | | | 439/148 |
| 2008/0305664 A1 * | 12/2008 | Shishikura | ........... | H01R 13/443 |
| | | | | 439/148 |
| 2010/0040334 A1 * | 2/2010 | Shannon | ............. | G02B 6/4246 |
| | | | | 385/89 |
| 2012/0289068 A1 * | 11/2012 | Bodette | ................ | H01R 13/443 |
| | | | | 439/88 |
| 2014/0273611 A1 * | 9/2014 | Goggin | ................ | H01R 13/465 |
| | | | | 439/491 |

* cited by examiner

CABLE ASSEMBLY MANAGEMENT ELEMENTS AND FIXTURE

CROSS-REFERENCE TO RELATED APPLICATIONS

This patent application claims the benefit of U.S. Provisional Patent Application No. 62/238,956, filed Oct. 8, 2015, which is incorporated herein by reference.

TECHNICAL FIELD

This disclosure relates generally to data systems and networks and, more particularly, to a fixture or tool and elements thereof for use while replacing components of network, information technology, or other systems to maintain correct positioning of cable assemblies.

BACKGROUND

Hardware associated with communications and data networks and other systems may be replaced or repaired as necessary to maximize operations and productivity. The hardware may include patch panels and/or servers located within data centers or dedicated rooms that house a plurality of such patch panels and servers. Patch panels include a panel of network ports that may connect incoming and outgoing lines of a local area network (LAN) or other types of communication, electronic or electrical systems. Connections between the network ports are made with patch cords or cable assemblies that allow circuits to be arranged and rearranged by plugging and unplugging the patch cords.

When it is desired to replace one or more patch panels, a technician physically removes the patch cords at the patch panel, removes the old patch panel, installs a new patch panel, and reconnects the patch cords to the new patch panel. Care must be taken to reconnect or transfer the patch cords from ports on the old patch panel to exactly the same ports on the new patch panel to ensure that the correct interconnections between components are maintained.

Other electronic components such as servers may include a plurality processors, memory, storage, and other electronic components connected to a variety of different types of cable assemblies. When replacing the servers or components of the servers, the attached cable assemblies must be physically disconnected, the old server or component removed, a new server or component installed, and the cable assemblies reconnected to the new server or component. As with the patch panels, ensuring that the cable assemblies are repositioned or reconnected to the correct connectors or ports of the server is important to maintain the functionality of communications and data networks.

Technicians sometimes label the ports/connectors, receptacles of electronic components and mating patch cords/cable assemblies to increase the likelihood that each of the patch cords/cable assemblies will be correctly transferred when replacing an electronic component. Such labeling operation is often time consuming and troubleshooting incorrectly connected patch cords or cable assemblies results in significant lost productivity. Accordingly, it is desirable to provide a system that will reduce the time required and increase the accuracy when replacing a patch panel, server, or any electronic device that involves removing and reconnecting patch cords or cable assemblies.

The foregoing background discussion is intended solely to aid the reader. It is not intended to limit the innovations described herein, nor to limit or expand the prior art discussed. Thus, the foregoing discussion should not be taken to indicate that any particular element of a prior system is unsuitable for use with the innovations described herein, nor is it intended to indicate that any element is essential in implementing the innovations described herein. The implementations and application of the innovations described herein are defined by the appended claims.

SUMMARY

In one aspect, a fixture for temporarily mounting connectors of a plurality of cable assemblies is provided for use while replacing an electronic component having a plurality of receptacles. Each cable assembly has a connector disposed in one of the receptacles. The fixture includes a body, an array of cavities disposed on the body, and an array of body indicia. Each cavity is configured to receive one of the connectors of the plurality of cable assemblies therein and each body indicia is disposed adjacent one of the cavities, with each body indicia being unique relative to other body indicia. A plurality of the pluggable identifier elements are provided with each pluggable identifier element being pluggable into one of the cavities and including an element indicia. Each element indicia corresponds to one of the body indicia and each element indicia is unique relative to other element indicia.

In another aspect, a kit of a pluggable identifier elements for use in replacing an electronic component is provided. The electronic component has a plurality of receptacles having a cross-section configured to receive a connector therein. The kit of pluggable identifier elements includes a plurality of pluggable identifier elements, with each pluggable identifier element having a pluggable end generally corresponding to the cross-section of the receptacles to permit insertion of the pluggable end into one of the receptacles. Each pluggable identifier element further includes an element indicia, with the element indicia of each pluggable identifier element being unique relative to other element indicia of the plurality of pluggable identifier elements.

In still another aspect, a method of replacing an electronic component is provided wherein the method comprises: a) providing an electronic component having a plurality of receptacles and a plurality of cable assemblies, each cable assembly having a connector disposed in one of the receptacles; b) providing a plurality of the pluggable identifier elements, each pluggable identifier element being pluggable into one of the receptacles and including an element indicia, each element indicia being unique relative to other element indicia; c) removing one of the connectors from one of the receptacles to define a vacant receptacle; d) associating the connector with an indicia, each indicia being unique relative to other indicia, and each indicia corresponding to one of the element indicia; e) plugging one of the pluggable identifier elements into the vacant receptacle, the pluggable identifier element including the element indicia corresponding to the indicia associated with the removed connector; f) repeating steps c)-e) until all connectors have been removed from the electronic component; g) providing a replacement electronic component having a plurality of additional receptacles, each additional receptacle corresponding to one of the receptacles; h) transferring each pluggable identifier element from one of the receptacles of the electronic component to a corresponding additional receptacle of the replacement electronic component; i) removing one of the pluggable identifier elements from one of the additional receptacles to define a vacant additional receptacle; j) plugging the connector associated with the indicia corresponding to the element indicia of the removed pluggable identifier element into the vacant additional receptacle; and k) repeating steps i)-j) until all connectors have been plugged into the additional electronic component.

DETAILED DESCRIPTION

Figure 1:
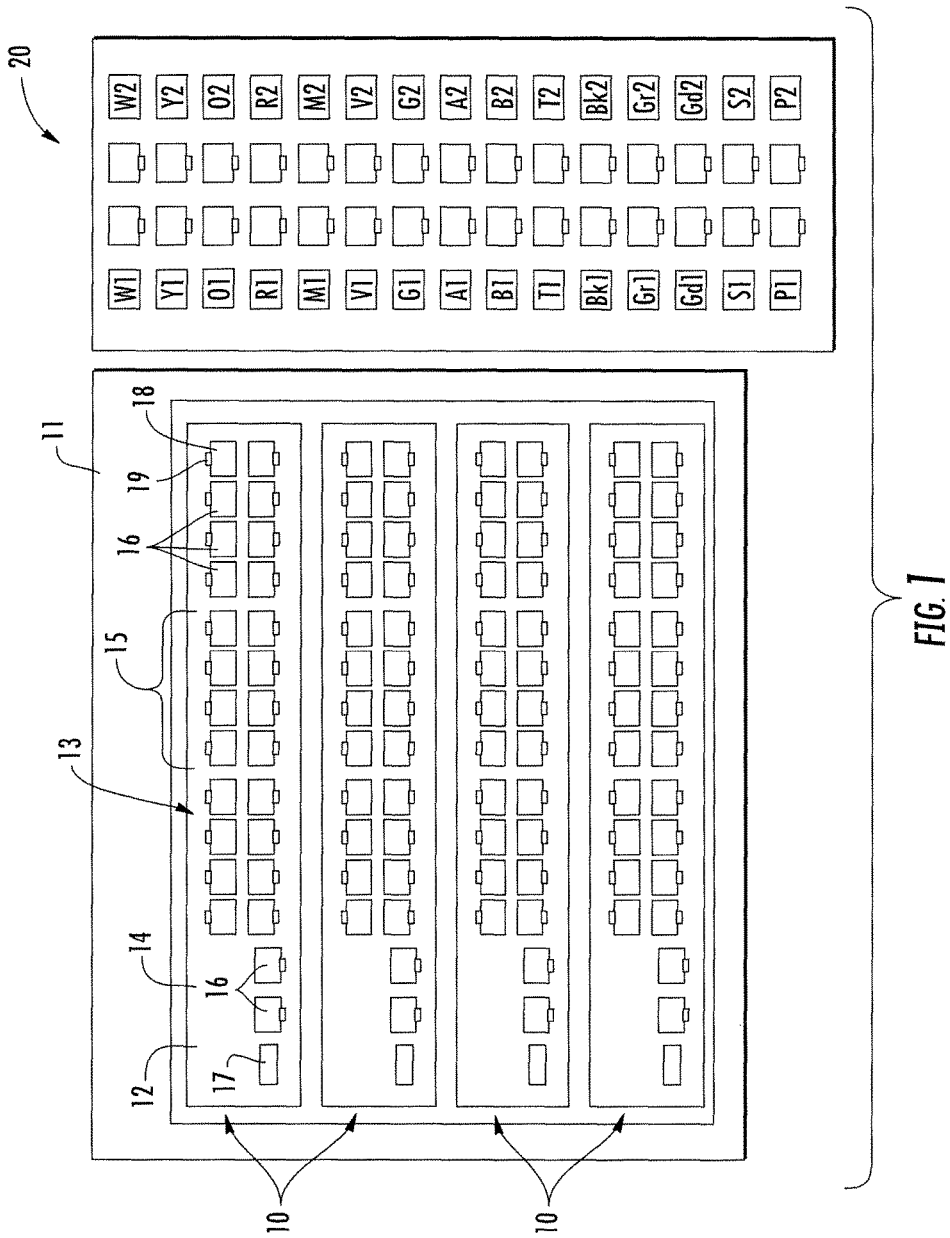
FIG. 1 is a front view of a rack containing a plurality of switches with an adjacent cable assembly management fixture in accordance with the disclosure.

Referring to FIG. 1, a plurality of switches 10 are depicted mounted on a rack 11. Each switch 10 includes an enclosure surrounding a plurality of electronic components (not shown) such as integrated circuits, circuit boards, and power supplies. The various components within the switch 10 may be directly or indirectly connected to one of the plurality of receptacle connectors 13 located at the front 14 of the enclosure 12. The connectors 13 are depicted as an array 15 of RJ-45 or Ethernet jacks or ports 16 together with two additional RJ-45 ports and a USB port 17. The switches 10 may include additional ports 16 and other types of connectors if desired. As described in further detail below, the concepts of the present disclosure are applicable regardless of the types and number of connectors being utilized. For example, rather than switches 10, the racks 11 could support patch panels, servers, storage arrays, or any other type of device having a plurality of cable assemblies connected thereto. As used herein, a cable assembly may include any type of cable (i.e., regardless of the number and type of transmission media) and associated connectors or components whether used for data or power and configured for electrical and fiber optic applications. In some applications, a cable assembly may have connectors at opposite ends of a cable. In other applications, a cable assembly may have a connector at one end of a cable and another component at the other end of the cable.

Figure 5:
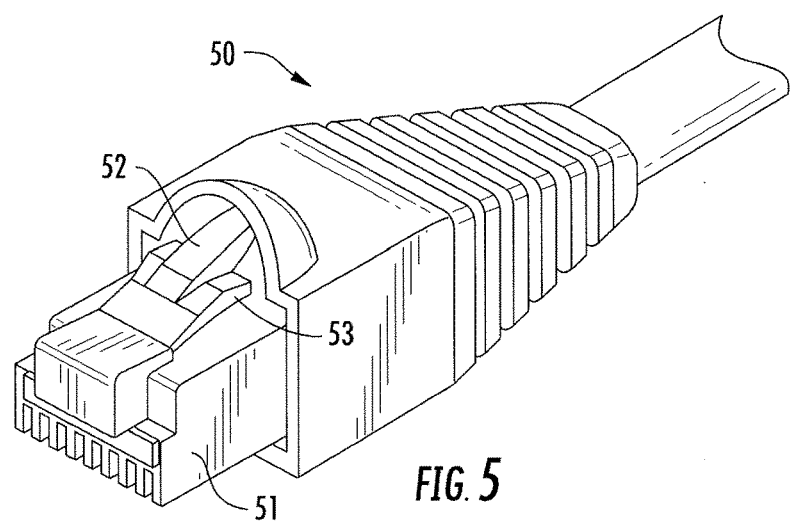
FIG. 5 is a perspective view of a portion of an RJ-45 cable assembly.
Figure 6:
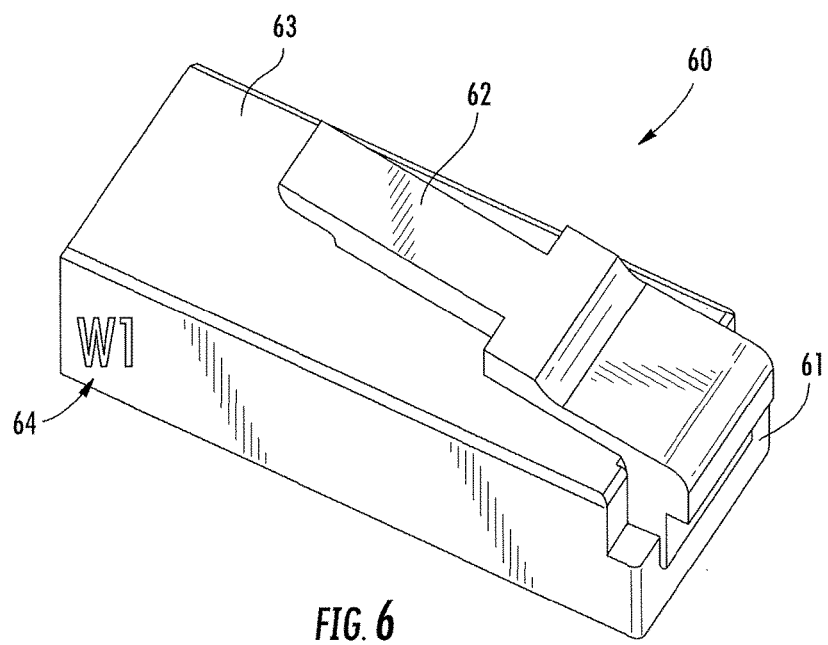
FIG. 6 is a perspective view of a pluggable identifier block in accordance with the disclosure.
Figure 7:
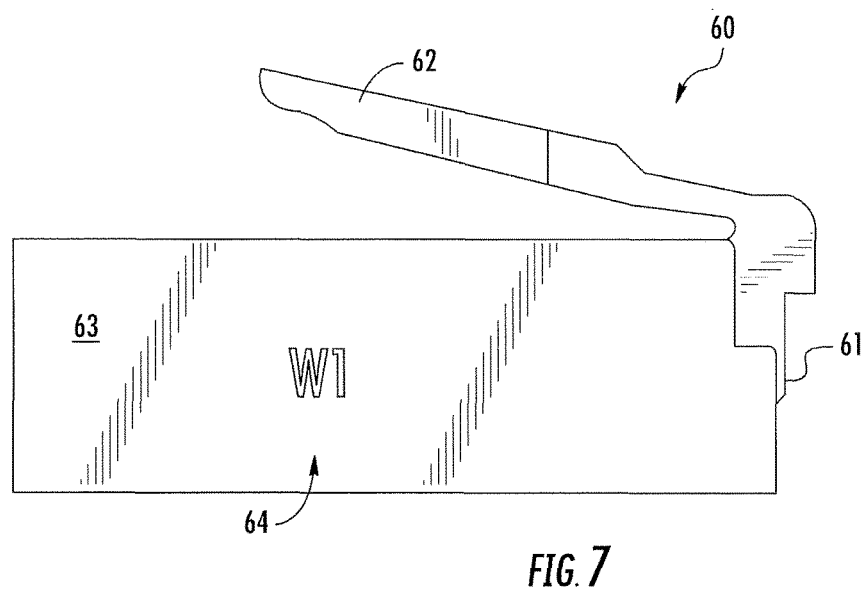
FIG. 7 is a side view of the pluggable identifier block of FIG. 6.

In operation, a plurality of cable assemblies with plug connectors are mated to the receptacle connectors 13 but are not depicted in FIG. 1 for clarity. An example of a cable assembly 50 having RJ-45 plug connectors 51 at each end is depicted in FIG. 5. The cable assemblies may extend between ports 16 of a single switch 10, between ports of different switches within the rack 11, or from a port within one of the switches to a connection remote from the switch.

Figure 2:
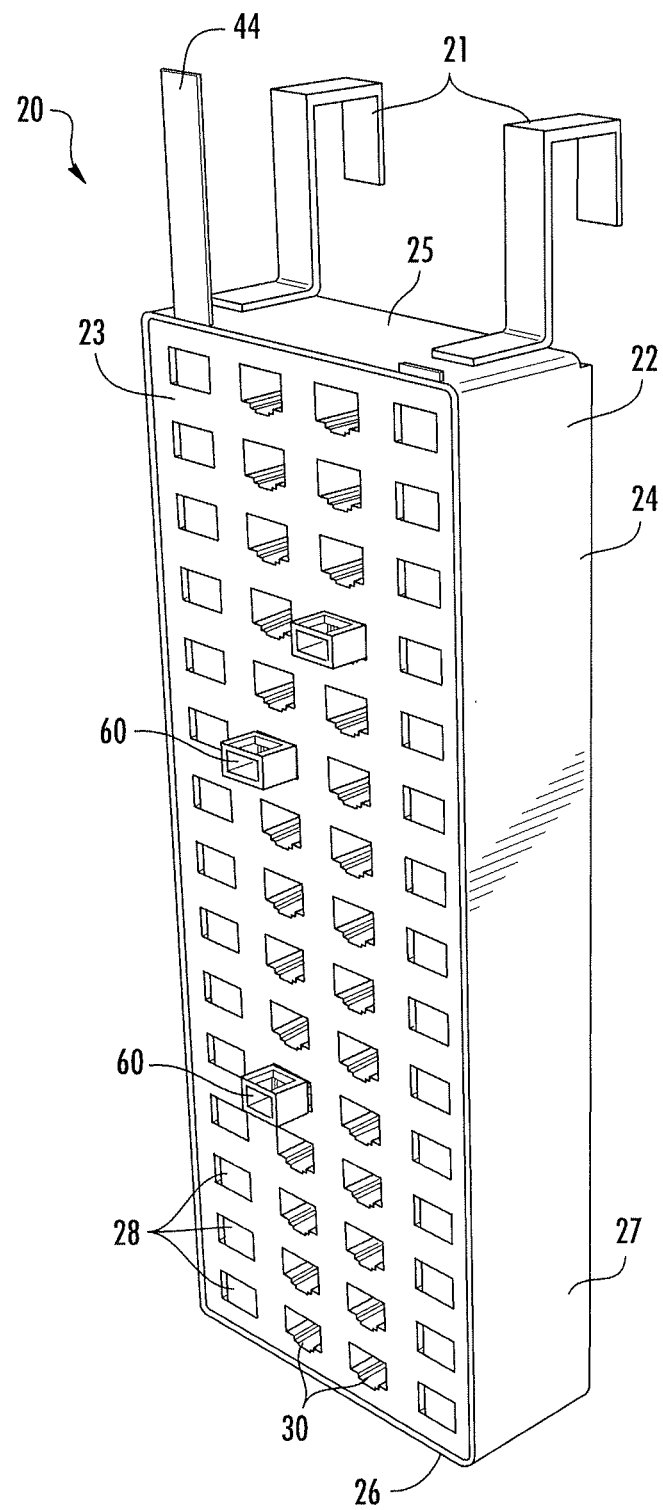
FIG. 2 is a perspective view of the cable assembly management fixture of FIG. 1.
Figure 3:
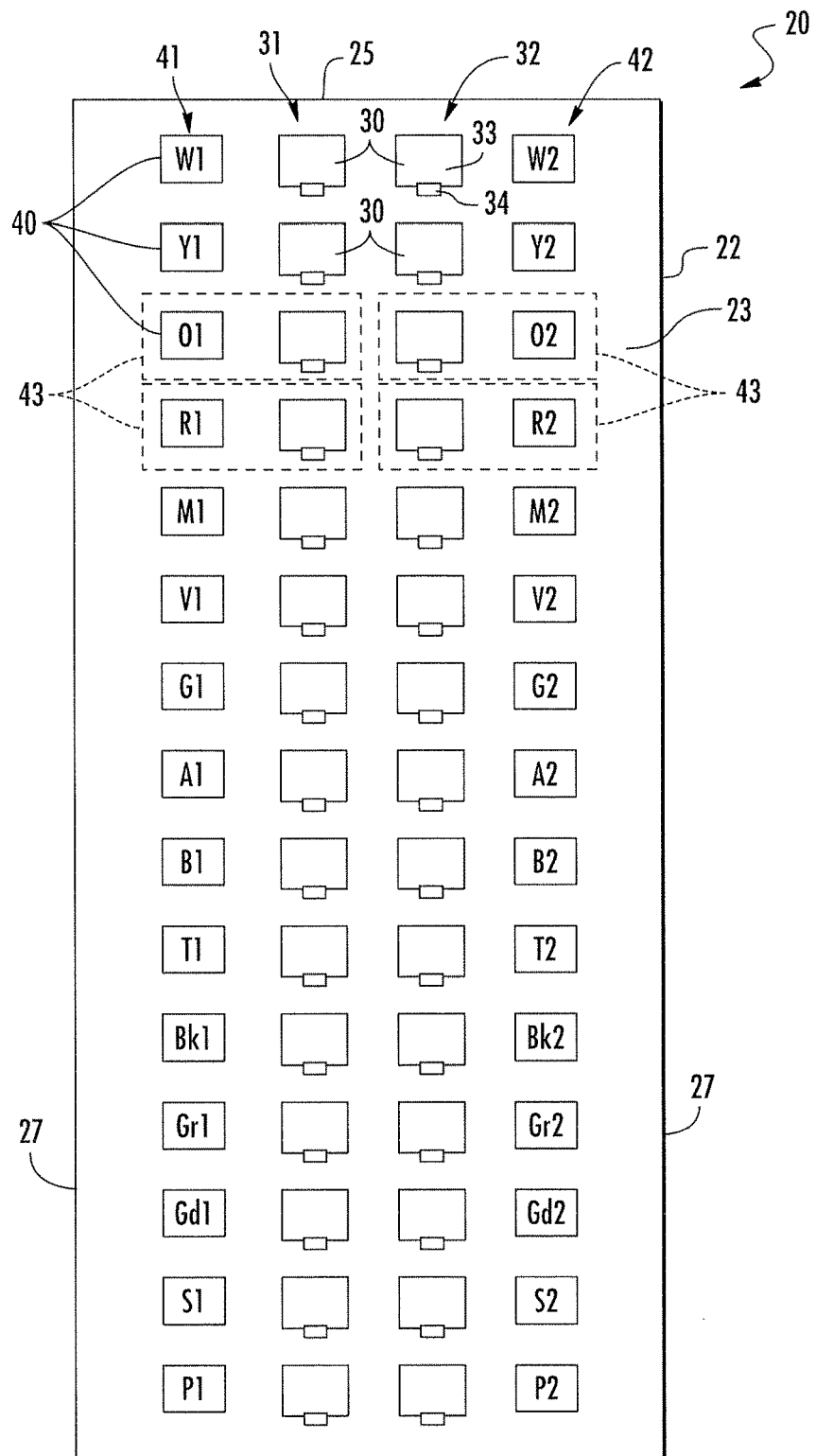
FIG. 3 is a front view of the cable assembly management fixture.

Referring to FIGS. 1-3, a cable assembly management fixture or tool 20 may be positioned adjacent the rack 11 of switches 10 in any desired manner. In some instances, the cable assembly management fixture 20 may be temporarily secured to the rack in front of the switches 10, but is depicted in FIG. 1 to the side of the switches for clarity. In one example, management fixture 20 may include a pair of hooks 21 for temporarily mounting the fixture to rack 11.

Cable assembly management fixture 20 has a body 22 which may be generally rectangular or any other desired shape. The body 22 has a front face 23, a rear face 24, an upper or top surface 25, a lower surface 26, and opposite side surfaces 27. Front face 23 has a plurality of connector receiving openings or cavities 30 therein. The cavities 30 may have any configuration and are depicted as a first vertical array 31 and a second vertical array 32 of identical openings. The connector receiving cavities 30 may have any configuration sufficient to temporarily retain the plug connectors 51 that have been disconnected from the switches 10. In one embodiment, the connector receiving cavities 30 may be configured to exactly match the mating interface of the connectors 13 of the switches 10. In an alternate embodiment, the connector receiving cavities 30 may have a shape or outline similar to those of the connectors 13 of the switches 10 so that the cavities are sufficient to mate with or secure the plug connectors 51 of the cable assemblies 50 to the body 22 but may otherwise not match the configuration of connectors 13. In other embodiments, the connector receiving cavities 30 may have any configuration sufficient to mate with or secure the plug connectors 51 of the cable assemblies 50 to the body 22.

Referring to FIGS. 1 and 5, RJ-45 receptacles or ports 16 and their mating RJ-45 plug connectors 51 have a deflectable locking structure to secure or lock a plug connector within a mating receptacle or port. More specifically, RJ-45 port 16 has a generally rectangular opening 18 with a rectangular recess 19 along one edge or surface and a locking shoulder (not shown) aligned with the recess. A mating RJ-45 plug connector 51 has a deflectable locking arm 52 with a locking ledge 53. When mating a plug connector 51 with a port 16, the locking arm 52 of the plug connector 51 is aligned with the recess 19 of the port 16. The plug connector 51 is inserted and the locking arm 52 deflected until the locking ledge 53 moves axially (in an insertion direction) past the locking shoulder at which point it snaps back to lock the plug connector in the port 16.

The connector receiving cavities 30 of cable assembly management fixture 20 are configured to generally resemble the interface and include the locking features of an RJ-45 port. The cavities 30 each have a generally rectangular opening 33 with a rectangular recess 34 along one edge or surface with a locking shoulder (not shown) aligned with the recess in the same manner as the RJ-45 ports 16. It should be noted that although the cavities 30 may be configured in a manner identical or similar to the receptacles or ports 15 of switches 10, it is not necessary for the cavities to include operative data transmission components such as conductive or metal terminals that are included in the RJ-45 ports 16 of the switches. In other words, the cavities 30 may be configured without operative data transmission or current carrying components such as metal terminals and shielding.

Cable assembly management fixture 20 may also include a plurality of position indicators or indicia 40 organized in a first vertical array 41 that corresponds to the first vertical array 31 of cavities 30 and a second vertical array 42 of indicia that corresponds to the second vertical array 32 of cavities. Each cavity 30 may have an adjacent position indicator 40 to create a cavity and indicator pair as indicated in dotted line at 43. The position indicators 40 may be configured in any desired manner so as to distinguish or identify individual ones of the cavities 30. For example, the position indicators 40 may be configured with unique colors, alphanumeric characters such as numbers and letters, symbols or shapes, or any combination thereof, as well as any other desired manner of distinguishing the cavities 30. The types of position indicators may be organized in any desired combination.

The type of position indicators 40 may be based upon the number of cavities 30 in the cable assembly management fixture 20. For example, if the cable assembly management fixture 20 does not include a significant number of cavities 30, each position indicator 40 may have a different color. When used with a greater number of cavities 30, it may be desirable or necessary to increase the number of unique colors or to utilize a unique number associated with each cavity rather than colors. In the embodiment depicted in FIGS. 1 and 3, each of the position indicators 40 of the first array 41 has a unique color (designated by an abbreviation in the drawings for illustrative purposes) and includes the reference or indicator number "1" to identify the first array. In one example, a position indicator may be white and include the number "1." In another example, the position indicator may be white and include an abbreviation for white as well as the number "1" (i.e., W1). The abbreviations of the colors utilized in FIGS. 1 and 3 are identified in Table 1 and are merely examples.

TABLE 1

| Abbreviation | Color | Abbreviation | Color |
|---|---|---|---|
| W | White | B | Blue |
| Y | Yellow | T | Teal |
| O | Orange | Bk | Black |
| R | Red | Gr | Gray |
| M | Magenta | Gd | Gold |
| V | Violet | S | Silver |
| G | Green | P | Purple |
| A | Aqua | | |

The position indicators 40 of the second array 42 may include colors that are identical to the position indicators of the first array 41 but also include a second reference or indicator number "2" to distinguish the cavities 30 of the second array 32 from those of the first array 31. In other words, in the embodiment depicted in FIGS. 1 and 3, the cavities 30 of each horizontal pair of cavities have position indicators 40 that are identical in color and are distinguished by a different reference number.

Figure 4:
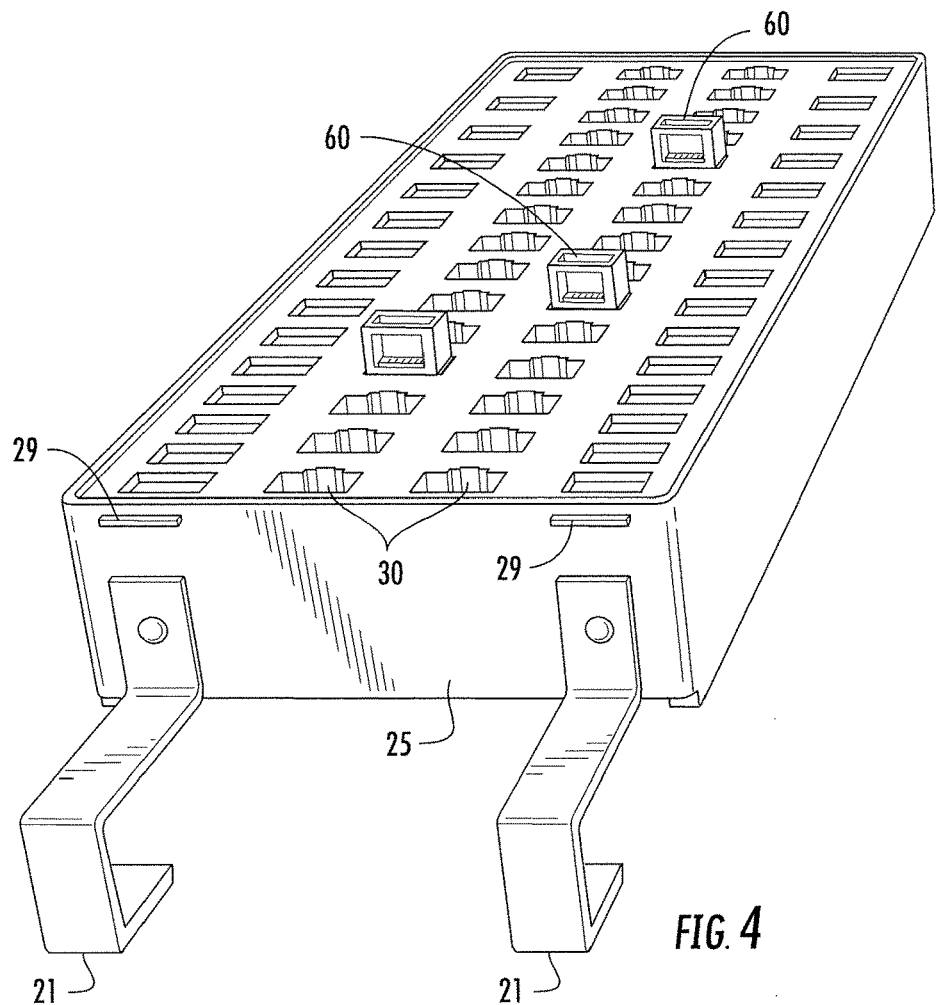
FIG. 4 is a top perspective view of the cable assembly management fixture.

As depicted in FIG. 2, front face 23 of body 22 of cable assembly management fixture 20 may be configured with a plurality of openings 28 that are horizontally aligned with cavities 30 to define the locations of the position indicators 40. The openings 28 extend from the front face 23 of body 22 horizontally towards the rear face 24. As depicted, the openings 28 extend only partway towards the rear face 24 but in some embodiments may extend all of the way through the body 22. A pair of vertical slots 29 (FIG. 4) extend from the upper surface 25 downward toward lower surface 26 and intersect with each of the horizontal openings 28.

The position indicators 40 may be configured as an insert that is positioned or inserted into the openings 28 to define the position indicator for each cavity 30. A clear or transparent plastic strip 44 may be inserted into each vertical slot 29 to close each opening 28 and secure or capture the position indicators 40 therein. The use of insertable position indicators 40 together with openings 28, and the transparent nature of the plastic strips 44 permits relatively simple customization of the position indicators 40 of the cable assembly management fixture 20.

In an alternate embodiment, the position indicators 40 may be labels or printed indicia that are applied or secured to the strips 44 that are inserted into the vertical slots 29. The position indicators 40 are configured so as to be aligned with each cavity 30 to define the position indicator for each cavity 30. In other words, the indicia such as colors and/or numbers, letters, etc. may be printed or otherwise applied to strips 44 and the strips secured within the vertical slots 29 so that the indicia are aligned with the appropriate cavities 30. In still another embodiment, the position indicators 40 may be electronic displays adjacent the cavities 30.

Referring to FIGS. 2, 4, 6, and 7, a pluggable identifier block or element 60 is configured in a manner similar to plug connectors 51. As depicted, the identifier block 60 includes a front or pluggable end 61 that is similar or generally resembles to the mating interface of a plug connector 51, a locking arm 62 that is similar to the locking arm 53 of the plug connector, and a rear body 63 that is configured to be manually graspable by a user. In some situations, the pluggable identifier block 60 may be longer than the plug connector 51 to facilitate manual handling of the block. With such a configuration, the pluggable identifier block 60 is insertable into the RJ-45 ports 16 of switches 10 and the cavities 30 of the cable assembly management fixture 20.

The pluggable end 61 may have any configuration sufficient to permit insertion and temporary retention of the pluggable identifier blocks 60 into the RJ-45 ports 16. In one embodiment, the pluggable end 61 may be configured to exactly match the mating interface of the connectors 13 of the switches 10. In an alternate embodiment, the pluggable end 61 may have a shape or outline similar to those of the plug connectors 51 of the cable assemblies 50 so that the pluggable ends 61 are sufficient to secure the pluggable identifier blocks 60 within the receptacles 16 but may otherwise not match the configuration of connectors 13.

It should be noted that although the pluggable end 61 may be configured in a manner identical or similar to the cross section of the RJ-45 plug connectors 51 so as to mate with port 16, it is not necessary for the pluggable identifier blocks 60 to include operative data transmission components such as conductive or metal terminals that are included in the RJ-45 plug connectors 51. In other words, the pluggable identifier blocks 60 may be configured without operative data transmission or current carrying components such as metal terminals and shielding.

The pluggable identifier blocks 60 are configured with position indicators or indicia 64 corresponding to the position indicators 40 of the cable assembly management fixture 20. More specifically, each body position indicator 40 of body 22 may include a corresponding or matching pluggable identifier block 60 with a matching block or element indicia 64. For example, if each position indicator 40 has a unique color, a plurality of pluggable identifier blocks 60 may be provided with each block corresponding to one of the colors of the position indicators. If, as depicted in FIG. 1, the body position indicators 40 include a color (designated by an abbreviation) and a number, the pluggable identifier blocks 60 will be similarly configured with indicia 64 having matching colors and numbers on the identifier blocks.

During the operation and use of the switches 10, a plurality of cable assemblies 50 are interconnected to the arrays 15 of RJ-45 ports 16 of the switches. In many instances, all of the ports 16 of the switches 10 may not have plug connectors 51 inserted therein. The additional RJ-45 ports 16 may have additional cable assemblies 50 inserted therein and the USB receptacle 17 may have a USB plug connector (not shown) inserted therein.

The cable assembly management fixture 20 may be configured for operation by loading a pluggable identifier block 60 in each cavity 30. The pluggable identifier blocks 60 are organized within the cavities 30 of the body 22 so that the position indicators 40 of the body are aligned with and correspond to the position indicators 64 of the identifier blocks. In other words, the color and number of the position indicators 40 for the cavities 30 match the color and number of the position indicators 64 for each pluggable identifier block 60.

Figure 8:
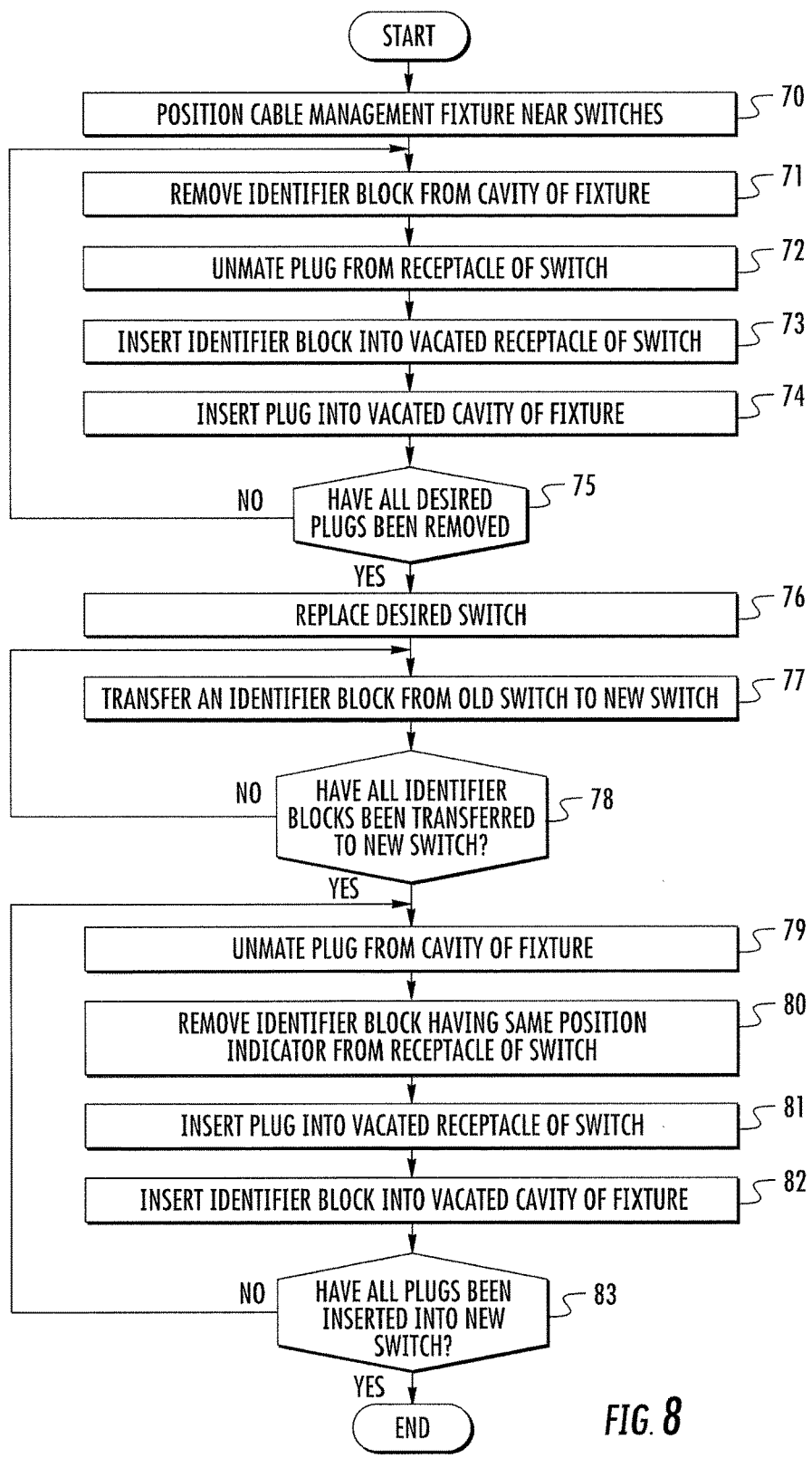
FIG. 8 is a flow chart illustrating a process for replacing electronic components in accordance with the disclosure.

The cable assembly management fixture 20 may be used when it is desired to disconnect a plurality of the cable assemblies 50 from one or more of the switches 10 such as to replace one or more switches or components within the switches. A flowchart depicting the use of a cable assembly management fixture 20 in association with the disconnection of a plurality of cable assemblies 50 from one or more of the switches 10 is depicted in FIG. 8. At stage 70, a fully loaded or prepared cable assembly management fixture 20 is mounted or positioned on or near the switches 10 such as on rack 11. A technician, such as an IT professional, may at stage 71 remove a pluggable identifier block 60 from a cavity 30 of the body 22 of the cable assembly management fixture 20 and then disconnect or unmate at stage 72 one of the RJ-45 plug connectors 51 from one of the RJ-45 ports 16 of one of the switches 10.

At stage 73, the technician may insert the pluggable identifier block 60 that was removed from the body 22 into the port 16 that was vacated by the removal of the RJ-45 plug connector 51. The RJ-45 plug connector 51 that was just removed from one of the switches 10 is inserted at stage 74 into the cavity 30 that was just vacated by the removal of the pluggable identifier block 60. At decision stage 75, the technician may determine whether all of the desired RJ-45 plug connectors 51 have been removed from their respective ports 16 of the various switches 10. If the desired number of RJ-45 plug connectors 51 have not been removed, the process of stages 71-75 is repeated. If the desired number of RJ-45 plug connectors 51 have been removed at decision stage 75, the technician may replace or install at stage 76 the switches 10 or the components within the switches as desired.

Through this sequence, the plug connectors 51 are removed from the switches 10 and positioned within the cavities 30 of the cable assembly management fixture 20 and a pluggable identifier block 60 corresponding to each cavity 30 is positioned within the ports 16 of the switch 10 vacated by the removal of the plug connectors.

Upon replacing the switches 10 or components of the switches, a pluggable identifier block 60 located in the switch 10 or the component being replaced is moved or transferred at stage 77 from the port 16 of the switch or component being replaced to the same port 16 of the new switch or component that was installed at stage 76. At decision stage 78, the technician may determine whether all of the pluggable identifier blocks 60 have been transferred from the switch 10 or the component being replaced to the new switch or component. In other words, at stages 77-78, the technician or technician moves the pluggable identifier blocks from each port 16 of the old switch 10 or component to the corresponding ports of the new switch or component.

Figure 9:
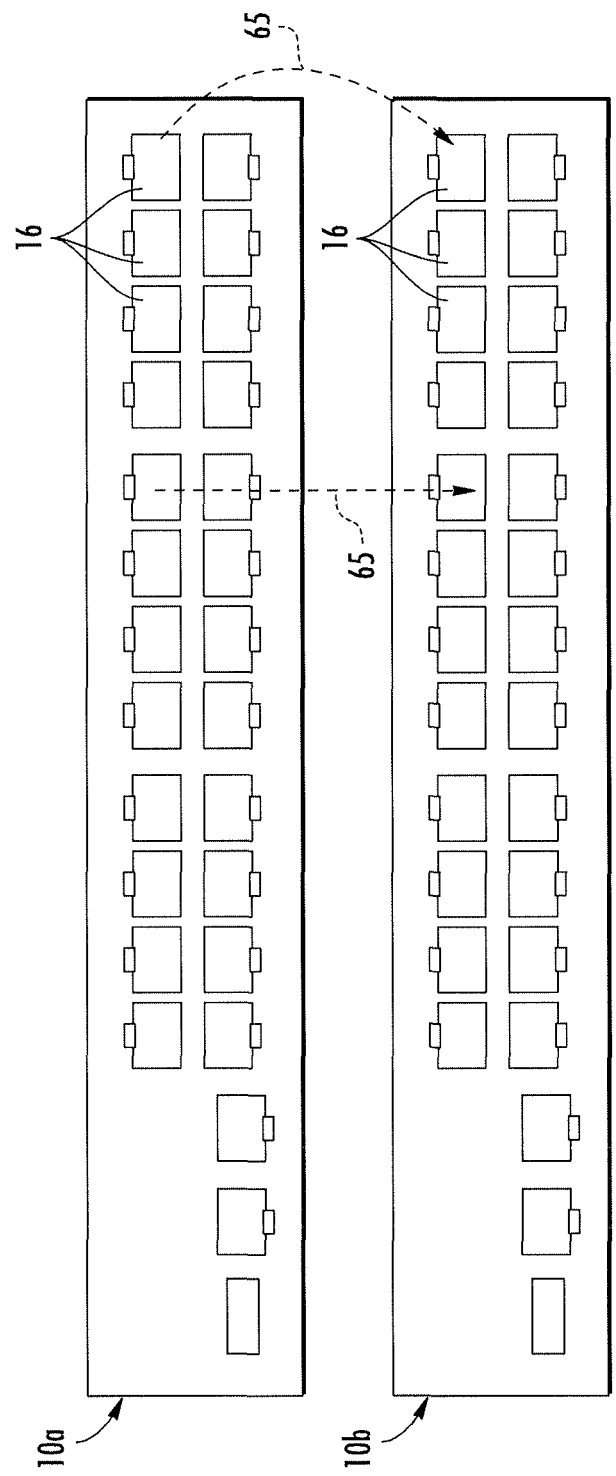
FIG. 9 is a front view of an old electronic component adjacent a new electronic component during a portion of the process of FIG. 8.

This process may be accomplished, for example, by positioning the old switch 10a on top of the new switch 10b with the ports aligned and facing in the same direction as depicted in FIG. 9. The technician may then sequentially move each pluggable identifier block 60 from a port 16 in the old switch 10a to the corresponding port in the new switch 10b as depicted in phantom at 65.

If all of the pluggable identifier blocks 60 have not been transferred at decision stage 78 from the old switch 10a or component to the new switch 10b or new component, the process at stage 77 is repeated.

Once all of the pluggable identifier blocks 60 have been transferred, the technician may reconnect the RJ-45 plug connectors 51 (temporarily stored or retained in cable assembly management fixture 20) to the switches 10 or components that have been replaced. To do so, the technician may generally reverse the sequence of stages 71-74. More specifically, at stage 79, the technician unmates an RJ-45 plug connector 51 from cavity 30 of cable assembly management fixture 20 and notes the position indicator 40 (e.g., color, number, etc.) associated with the cavity 30 from which the plug connector was removed. The technician may at stage 80 remove from a port 16 of switch 10 the pluggable identifier block 60 having a position indicator 64 corresponding to the position indicator 40 of the cavity 30 that was vacated by the removal of plug connector 51.

The technician may insert at stage 81 the RJ-45 plug connector 51 removed from the cable assembly management fixture 20 into the open RJ-45 port 16 vacated by the removal of the pluggable identifier block 60. At stage 82, the technician may insert the pluggable identifier block 60 into the cavity 30 of the cable assembly management fixture 20 vacated by the removal of the RJ-45 plug connector 51. It should be noted that the position indicator 64 of the pluggable identifier block 60 should match the position indicator 40 of the cavity 30 into which the pluggable identifier block was inserted.

At decision stage 83, the technician may determine whether all of the RJ-45 plug connectors 51 have been removed from the cable assembly management fixture 20 and inserted into the new switch 10. If all of the plug connectors 51 have not been removed from the cable assembly management fixture 20, the process of stages 79-83 may be repeated. If all of the plug connectors 51 have been removed from the cable assembly management fixture 20, the technician may remove the cable assembly management fixture from its position near the switches 10 and the switches placed back in operation.

A plurality of alternate designs are possible. A cable assembly management fixture may be used with any system in which it is desirable to maintain the position of a plurality of pluggable components when changing aspects of a system. For example, the cable assembly management fixture may be configured to receive or secure any type of electrical or optical fiber connector. Such connectors may include standard interfaces such as RJ-45, SCSI/iSCSI, SAS/SATA, USB, Firewire®, coaxial, HDMI® as well as any other standard or non-standard video, audio, or data interface.

Figure 10:
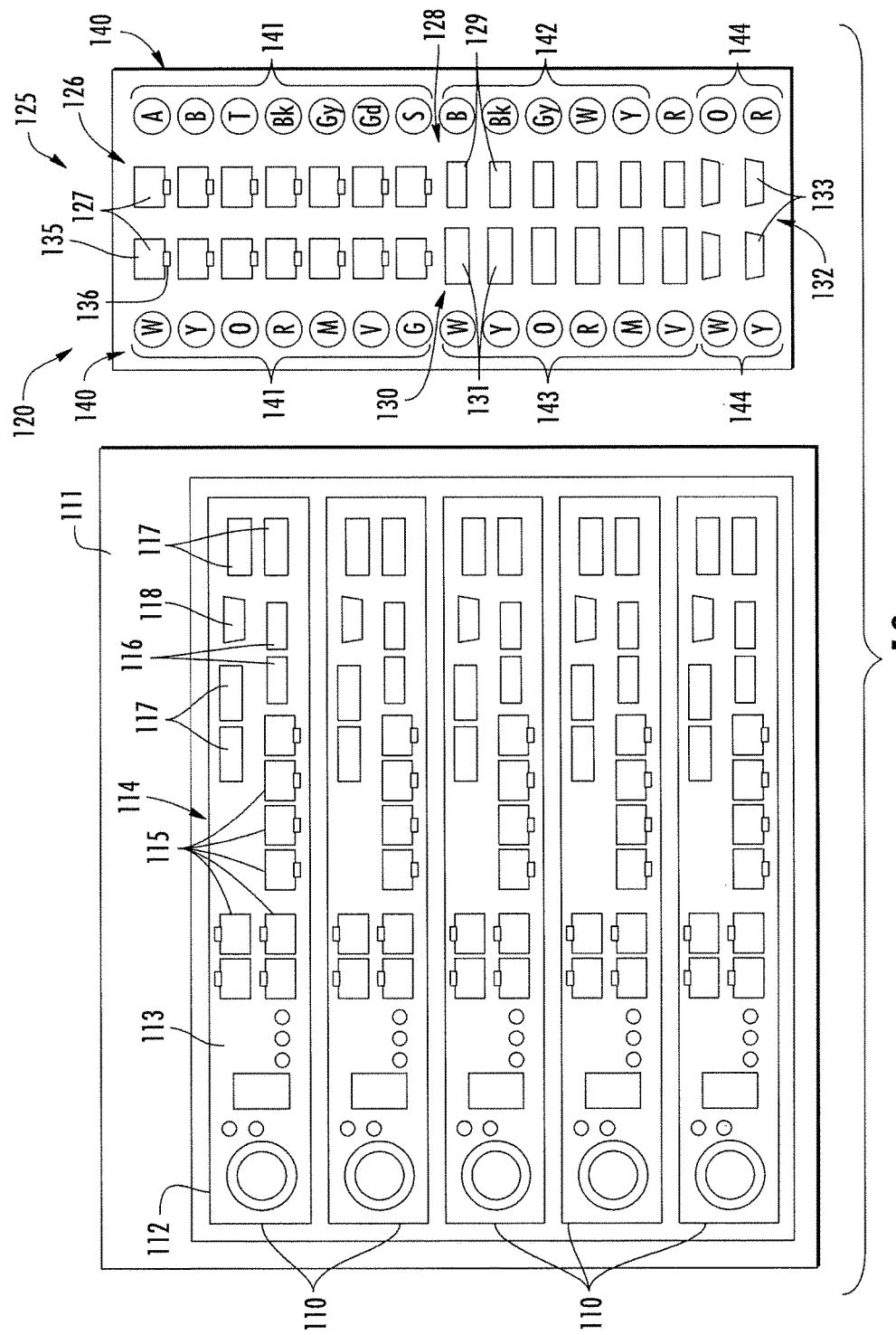
FIG. 10 is a front view of a rack containing a plurality of servers with an alternate embodiment of a cable assembly management fixture adjacent thereto.

The concepts disclosed herein may be used with any type of electronic components having a plurality of cable assemblies connected thereto. Referring to FIG. 10, an alternate embodiment of a cable assembly management fixture 120 is depicted adjacent a plurality of servers 110 mounted on rack 111. Each server 110 includes an enclosure 112 surrounding a plurality of electronic or optical components (not shown) including processors, memory and secondary storage devices, circuit boards, power supplies, and other components. The various components within the server 110 may be directly or indirectly connected to one of the plurality of connectors 114 located at the rear 113 of the enclosure. As depicted, the connectors 114 include a plurality of RJ-45 or Ethernet jacks or ports 115, a plurality of USB ports 116, a plurality of SAS ports 117, and a D-shaped connector 118. Although identically configured in FIG. 10, the servers 110 may be configured in any desired manner. The servers 110 may include additional and other types of connectors if desired. The concepts of the present disclosure are applicable regardless of the types of connectors being utilized.

Figure 11:
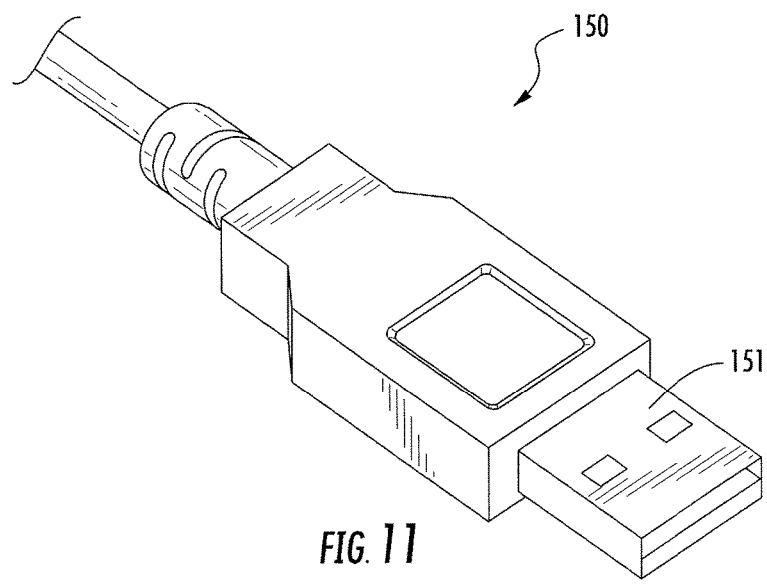
FIG. 11 is a perspective view of a portion of a USB connector.
Figure 12:
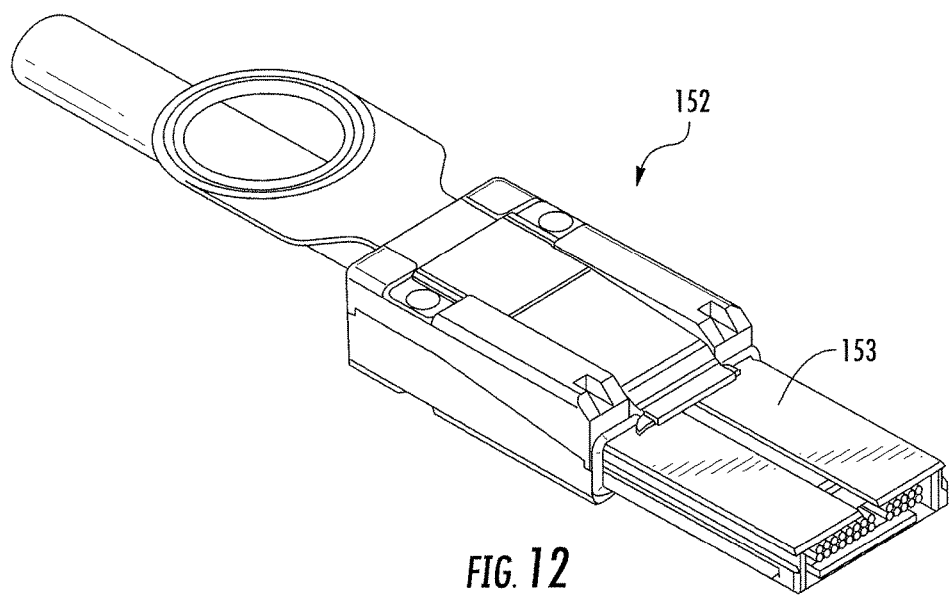
FIG. 12 is a perspective view of a portion of an eSATA connector assembly.
Figure 13:
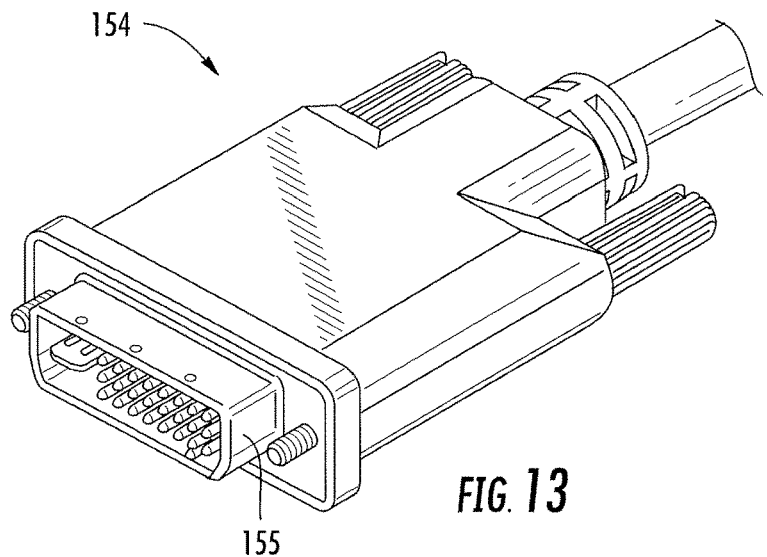
FIG. 13 is a perspective view of a portion of a connector assembly having a D-shaped connector.

As with FIG. 1, a plurality of cable assemblies with connectors at ends thereof may be mated to the connectors 114 but are not depicted in FIG. 10 for clarity. An example of an end of a cable assembly 50 having an RJ-45 plug connector 51 at each end is depicted in FIG. 5 as described above. An end of a cable assembly 150 having a USB plug connector 151 is depicted in FIG. 11, an end of a cable assembly 152 having a eSATA plug connector 153 is depicted in FIG. 12, and an end of a cable assembly 154 having a D-shaped plug connector 155 is depicted in FIG. 13.

Referring back to FIG. 10, cable assembly management fixture 120 is depicted adjacent the rack 111 of servers 110. The cable assembly management fixture 120 may be positioned adjacent the rack 111 in any desired manner. Cable assembly management fixture 120 may be generally identical to cable assembly management fixture 20 described above but has a plurality of connector receiving cavities 125 configured to receive the connectors on the ends of the cable assemblies connected to the servers 110. For example, cable assembly management fixture 120 is depicted with a first array 126 of fourteen RJ-45 ports 127, a second array 128 of six USB ports 129, a third array 130 of six eSATA ports 131, and a fourth array 132 of four D-shaped connectors 133.

The connector receiving cavities 125 may have any configuration sufficient to temporarily retain the connectors that have been disconnected from the servers 110. In one embodiment, the cavities 125 may be configured to exactly match the mating interface of the connectors 114. More specifically, the first array 126 of RJ-45 ports 127 may be configured in the same manner as the RJ-45 ports 115 of the servers 110 so as to mate with the RJ-45 plug connectors 51 of the cable assembly 50. The second array 128 of USB ports 129 may be configured in the same manner as the USB ports 116 of the servers 110 so as to mate with the USB plug connectors 151 at the end of cable assembly 150. The third array 130 of eSATA ports 131 may be configured in the same manner as the eSATA ports 117 of servers 110 so as to mate with the eSATA plug connectors 153 at the end of cable assembly 154. The fourth array 132 of D-shaped connectors 133 may be configured in the same manner as the D-shaped connector 118 of servers 110 so as to mate with the D-shaped plug connectors 154 at the end of cable assembly 155.

In an alternate embodiment, the connector receiving cavities 125 may have a shape or outline similar to those of the connectors at the ends of the cables mated to the servers 110 so that the cavities are sufficient to mate with or secure the connectors of the cable assemblies to the cable assembly management fixture 120. In other words, the cavities 125 may have openings or profiles that are similar in shape to the cross-section of the respective plug connectors so that the connectors may be inserted into the cavities. In still other embodiments, the cavities 125 may have any shaped opening into which the plug connectors may be inserted and retained therein.

Those cavities 125 configured to receive a plug connector that includes a portion of a locking structure may be configured with the same locking structure as the receptacle or port on the servers 110. For example, RJ-45 ports 127 of cable assembly management fixture 120 may include a generally rectangular opening 135 with a rectangular recess 136 along one edge with a locking shoulder (not shown) aligned with the recess. In other instances, the mating connector assemblies may be secured to the cavities 125 of the cable assembly management fixture 120 by any desired structure or may rely on friction.

Although the cavities 125 may be configured in a manner identical or similar to the connectors or ports 114 of server 110, the cavities may not include operative data transmission components such as conductive or metal terminals and shields or optical fiber components as described above.

Cable assembly management fixture 120 includes a plurality of position indicators 140 as described above. In one embodiment, the position indicators may be configured as described above. However, because of the different types of plug connectors that will be positioned within the cavities 125, the position indicators 125 may be formed or grouped into a plurality of sets based upon the type of plug connector. For example, each of the position indicators 141 corresponding to the first array 126 of RJ-45 jacks 127 have a different color. The position indicators 142 corresponding to the second array 128 of USB ports 129 each have a different color but the colors may correspond to those used with the first array 126. Similarly, the position indicators 143 corresponding to the third array 130 of eSATA ports 131 each have a different color but the colors may correspond to those used with the first array 126 and/or the second array 128. Finally, the position indicators 144 corresponding to the fourth array 132 of D-shaped connectors 133 each have a different color but the colors may correspond to those used with the first array 126, the second array 128, and/or the third array 130. The colors or any other chosen position indicators may be used in more than one array since each type of connector will only mate with one shaped cavity or port.

Body 22 of the cable assembly management fixtures 20, 120 may be formed of any desired material and in any desired manner. In one embodiment, the body 22 may be formed of a resin with one or more molded components. For example, the cable receiving cavities 25, 125 may be molded as part of the body 22 or components thereof.

Figure 14:
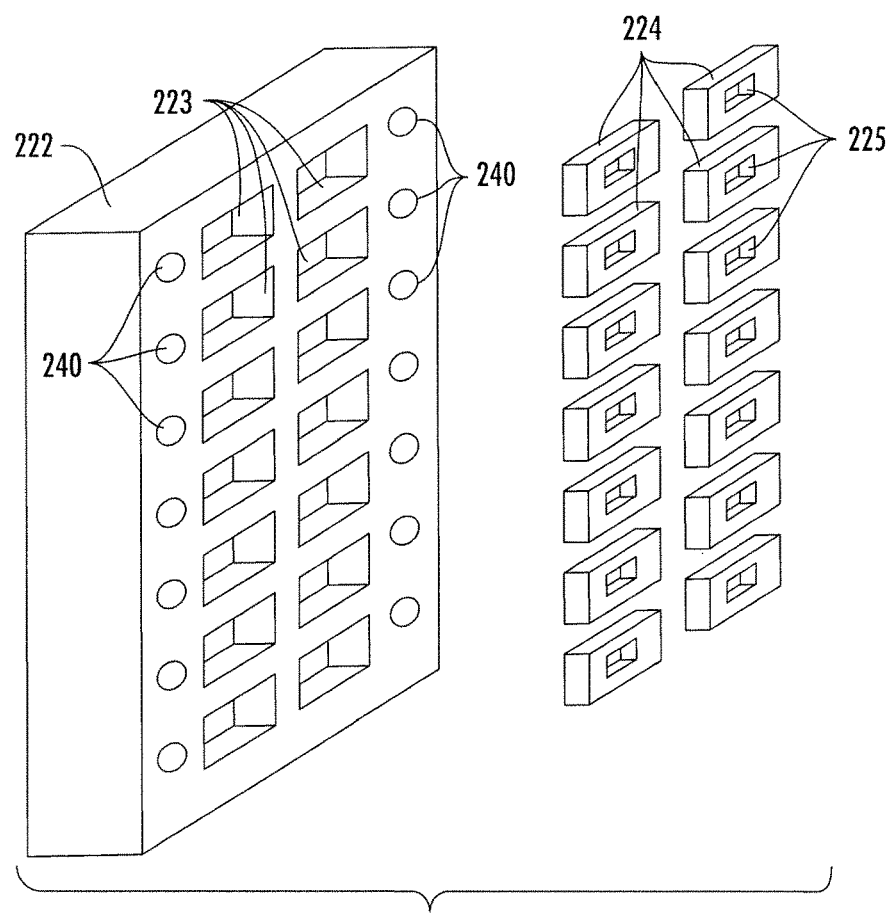
FIG. 14 is a perspective view of still another embodiment of a cable assembly management fixture in accordance with the disclosure.

To increase the flexibility of the cable assembly management fixtures 20, 120, it may be desirable to provide for ready customization of the cable receiving cavities 30, 125. For example, the configuration of servers 110 may vary depending upon the application for which they are being used. In another embodiment, depicted in FIG. 14, a cable assembly management fixture 220 includes a body 222 or a portion thereof formed with a plurality of identically shaped insert receiving openings 223 configured to receive modular cavity inserts 224 therein. Each cavity insert 224 may be configured with one or more cavities 225 having any desired shape such as those similar to an RJ-45 port 115, a USB port 116, an eSATA port 117, a D-shaped connector 118, or any other desired port or connector. In other words, one side of cavity inset 224 has a plug shape to fit into opening 223 and the opposite side has one or more cavities 225. The cavity inserts 224 may be inserted or positioned and secured within the openings 223 in any desired manner to create a cable assembly management fixture having arrays of the desired ports and connectors. In one embodiment, the cavity inserts 224 may be secured within openings 223 with an adhesive. In another, the inserts 224 may be snapped into the openings 223 and locked in place. Position indicators 240 are located adjacent each cavity 225 and may be disposed on body 240 or the cavity inserts 224.

Figure 16:
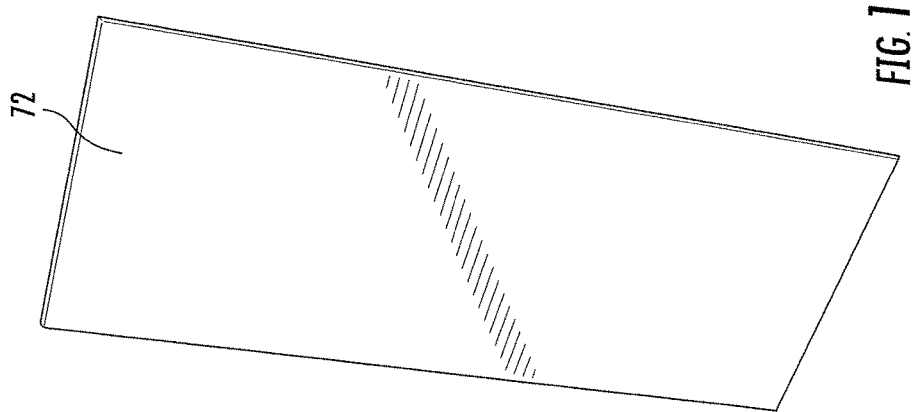
FIG. 16 is a perspective view of a rear cover mountable to the rear side of the cable assembly management fixture of FIG. 15.
Figure 15:
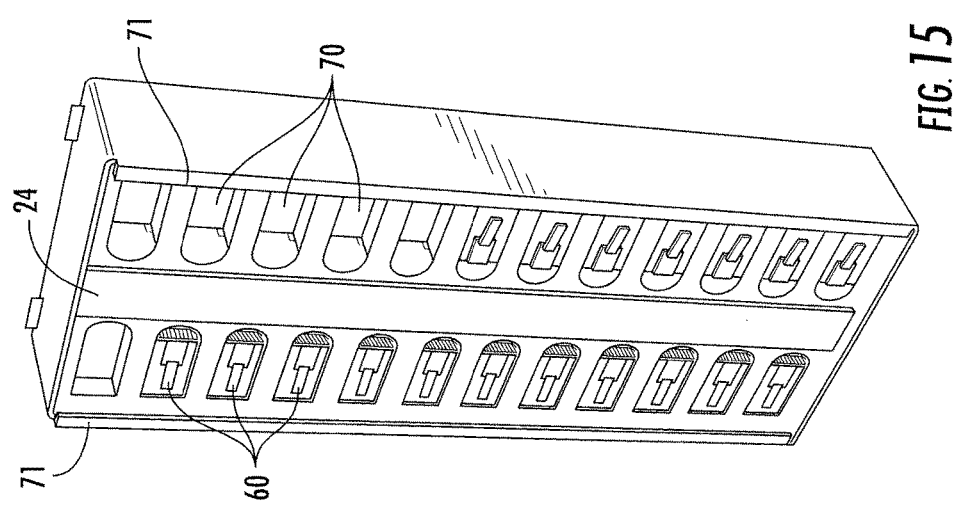
FIG. 15 is a rear perspective view of the cable assembly management fixture of FIG. 2.

Referring to FIGS. 15-16, the rear face 24 of body 22 may include a plurality of recesses or openings 70 in which pluggable identifier blocks 60 may be stored when not in use. A pair of space apart rails 71 may extend from the rear face 24 along the sidewall 27. A rear cover 72 may be provided that slidingly engages the rails 71 to guide the rear cover and seal the openings 70 and secure the pluggable identifier blocks 60 within the cable assembly management fixture 20, 120. Other manners of storing or transporting pluggable identifier blocks 60 are contemplated.

In still another embodiment, pluggable insert blocks or elements 60 may be provided that are separate from or used without a cable assembly management fixture 20. In such case, a plurality of pluggable insert blocks 60 and a plurality of cable assembly identifiers (not shown) are provided. One pluggable insert block may be associated with each cable assembly identifier. In some instances, the cable assembly identifiers may be removably connected to their associated pluggable insert block. Each pair of associated pluggable insert block 60 and cable assembly identifier have the same unique indicia.

The pluggable insert blocks 60 may be generally configured and used as described above. The cable assembly identifier may be configured to be secured to either the cable or the connector of a cable assembly. Upon removing a connector from a receptacle of a switch 10, a pluggable insert element 60 may be inserted into the vacated receptacle and the cable assembly identifier associated with that pluggable insert element may be attached to the cable assembly (either the cable or the connector) removed from the receptacle of the switch. The process may be repeated as otherwise described above.

It will be appreciated that the foregoing description provides examples of the disclosed system and technique. However, it is contemplated that other implementations of the disclosure may differ in detail from the foregoing examples. The system and techniques disclosed herein are applicable to many types of devices. For example, the system and techniques may also be applicable when replacing hydraulic components having hydraulic lines connected thereto. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A fixture for temporarily mounting connectors of a plurality of cable assemblies while replacing an electronic component having a plurality of receptacles, each cable assembly having a connector disposed in one of the receptacles, the fixture comprising:
a body; an array of cavities disposed on the body, each cavity being configured to receive one of the connectors of the plurality of cable assemblies therein; an array of body indicia, each body indicia being disposed adjacent one of the cavities, each body indicia being unique relative to other body indicia; and a plurality of the pluggable identifier elements, each pluggable identifier element being pluggable into one of the cavities and including an element indicia, each element indicia corresponding to one of the body indicia, each element indicia being unique relative to other element indicia.

2. The fixture of claim 1, wherein the body indicia and the element indicia include a plurality of colors.

3. The fixture of claim 1, wherein the body indicia and the element indicia include a plurality of alphanumeric characters.

4. The fixture of claim 1, wherein the body indicia and the element indicia include a plurality of colors and alphanumeric characters.

5. The fixture of claim 1, wherein the array of cavities are first cavities configured to receive a first connector therein and the plurality of pluggable identifier elements are first pluggable identifier elements, and further comprising a plurality of second cavities, each second cavity being configured to receive a second connector therein, the first connectors and the second connectors being differently configured, and a plurality of second pluggable identifier elements, each second pluggable identifier element being pluggable into one of the second cavities.

6. The fixture of claim 5, wherein the body indicia are first body indicia and the element indicia are first element indicia, and further comprising a plurality of second body indicia, each second body indicia being disposed adjacent one of the second cavities and each second body indicia being unique relative to other second body indicia, and a plurality of second element indicia, each second pluggable identifier element including one of the second element indicia, each second element indicia corresponding to one of the second body indicia, and each second element indicia being unique relative to other second element indicia.

7. The fixture of claim 6, wherein one of the first body indicia is identical to one of the second body indicia.

8. The fixture of claim 1, wherein the array of cavities are first cavities configured to receive a first connector therein and the plurality of pluggable identifier elements are first pluggable identifier elements, and further comprising a plurality of second cavities, each second cavity being configured to receive a second connector therein, the first connectors and the second connectors being identically configured, a plurality of second pluggable identifier elements, each second pluggable identifier element being pluggable into one of the second cavities and, wherein the body indicia are first body indicia and the element indicia are first element indicia, and further comprising a plurality of second body indicia, each second body indicia being disposed adjacent one of the second cavities and each second body indicia being unique relative to the first body indicia and other second body indicia, and a plurality of second element indicia, each second pluggable identifier element including one of the second element indicia, each second element indicia corresponding to one of the second body indicia, and each second element indicia being unique relative to the first element indicia and the other second element indicia.

9. The fixture of claim 1, wherein the connectors are electrical connectors.

10. The fixture of claim 1, wherein the connectors are optical connectors.

11. The fixture of claim 1, wherein the cavities do not include data transmission components therein.

12. The fixture of claim 1, wherein each connector has a connector length, each pluggable identifier element has an element length, and the element length is greater than the connector length.

13. The fixture of claim 1, wherein the body includes a plurality of insert receiving openings, and further comprising a plurality inserts, each insert including one of the cavities, and one insert being disposed in each insert-receiving opening.

14. The fixture of claim 13, wherein each insert includes a projection disposed in one of the insert-receiving opening.

15. A kit of a plurality of the pluggable identifier elements for use in replacing an electronic components, the electronic component having a plurality of first and second receptacles, the first receptacles having a first cross-section configured to receive a first connector therein, the second receptacles having a second cross-section configured to receive a second connector therein, the first and second receptacles being differently configured, the kit of pluggable identifier elements comprising:
  a plurality of first pluggable identifier elements, each first pluggable identifier element having a pluggable end generally corresponding to the cross-section of the first receptacles to permit insertion of the pluggable end into one of the first receptacles;
  a plurality of second pluggable identifier elements, each second pluggable identifier element having a pluggable end generally corresponding to the cross-section of the second receptacles to permit insertion of the pluggable end into one of the second receptacles; and
  each of the first and second pluggable identifier elements further including an element indicia, the element indicia of each of the first and second pluggable identifier elements being unique relative to other element indicia of the first and second pluggable identifier elements.

16. The kit of claim 15, wherein the element indicia include a plurality of colors.

17. The kit of claim 16, wherein the element indicia include a plurality of alphanumeric characters.

18. A method of replacing an electronic component, comprising:
  a) providing an electronic component having a plurality of receptacles and a plurality of cable assemblies, each cable assembly having a connector disposed in one of the receptacles;
  b) providing a plurality of the pluggable identifier elements, each pluggable identifier element being pluggable into one of the receptacles and including an element indicia, each element indicia being unique relative to other element indicia;
  c) removing one of the connectors from one of the receptacles to define a vacant receptacle;
  d) associating the cable assembly of the removed connector with an indicia, each indicia being unique relative to other indicia, and each indicia corresponding to one of the element indicia;
  e) plugging one of the pluggable identifier elements into the vacant receptacle, the pluggable identifier element including the element indicia corresponding to the indicia associated with the cable assembly of the removed connector;
  f) repeating steps c)-e) until all connectors have been removed from the electronic component;
  g) providing a replacement electronic component having a plurality of additional receptacles, each additional receptacle corresponding to one of the receptacles;
  h) transferring each pluggable identifier element from one of the receptacles of the electronic component to a corresponding additional receptacle of the replacement electronic component;
  i) removing one of the pluggable identifier elements from one of the additional receptacles to define a vacant additional receptacle;
  j) plugging the connector of the cable assembly associated with the indicia corresponding to the element indicia of the removed pluggable identifier element into the vacant additional receptacle;
  k) repeating steps i)-j) until all connectors have been plugged into the additional electronic component.

19. The method of claim 18 further comprising:
  l) providing a body having an array of cavities disposed on the body, each cavity being configured to receive one of the connectors of the plurality of cable assemblies therein, and an array of body indicia, each body indicia being disposed adjacent one of the cavities, each body indicia comprising one of the indicia;
  m) after step c), plugging the connector into one of the cavities to associate the connector with one of the body indicia and wherein step f) further includes plugging the connector into one of the cavities; and
  n) prior to step j, removing the connector associated with the body indicia from the cavity adjacent the body indicia corresponding to the element indicia and wherein step k) further includes removing the connector from the cavity.

* * * * *